US006887393B2

(12) United States Patent
Conta et al.

(10) Patent No.: US 6,887,393 B2
(45) Date of Patent: May 3, 2005

(54) MONOLITHIC PRINTHEAD WITH SELF-ALIGNED GROOVE AND RELATIVE MANUFACTURING PROCESS

(75) Inventors: Renato Conta, Ivrea (IT); Anna Merialdo, Ivrea (IT)

(73) Assignee: Olivetti Tecnost S.p.A., Turin (IT)

( * ) Notice: Subject to any disclaimer, the term of this patent is extended or adjusted under 35 U.S.C. 154(b) by 0 days.

(21) Appl. No.: 10/344,412

(22) PCT Filed: Aug. 22, 2001

(86) PCT No.: PCT/IT01/00448

§ 371 (c)(1),
(2), (4) Date: Feb. 19, 2003

(87) PCT Pub. No.: WO02/16140

PCT Pub. Date: Feb. 28, 2002

(65) Prior Publication Data

US 2003/0156161 A1 Aug. 21, 2003

(30) Foreign Application Priority Data

Aug. 23, 2000 (IT) .................................... TO2000A0813

(51) Int. Cl.[7] ................................................ H01L 21/00

(52) U.S. Cl. ............................... 216/2; 216/27; 216/41; 216/57

(58) Field of Search ................................ 216/2, 27, 41, 216/57

(56) References Cited

U.S. PATENT DOCUMENTS

| | | | | |
|---|---|---|---|---|
| 5,308,442 | A | | 5/1994 | Taub et al. |
| 5,635,966 | A | | 6/1997 | Keefe et al. |
| 5,658,471 | A | * | 8/1997 | Murthy et al. ................ 216/27 |
| 6,143,190 | A | * | 11/2000 | Yagi et al. .................... 216/27 |

FOREIGN PATENT DOCUMENTS

| | | | |
|---|---|---|---|
| EP | 0713774 | A2 | 5/1996 |
| EP | 0841167 | A2 | 5/1998 |
| EP | 0956954 | A2 | 11/1999 |
| WO | WO 01/03934 | A1 | 1/2001 |

* cited by examiner

*Primary Examiner*—Allan Olsen
(74) *Attorney, Agent, or Firm*—Banner & Witcoff, Ltd.

(57) ABSTRACT

A monolithic thermal ink jet printhead (40) comprising a groove (45), a plurality of chambers (74) and nozzles (56) is manufactured by means of steps of: (203, 205) partially etching the groove (45) by means of a "dry" process and a "wet" process; (210) depositing a plurality of sacrificial layers (54); (212) obtaining a plurality of casts (156); (216) completing the etching of the groove (45) by means of an electrochemical process; and (220) removing the casts (156) and the sacrificial layers (54) in such a way as to obtain a plurality of nozzles (56) and chambers (74).

8 Claims, 15 Drawing Sheets

MONOLITHIC PRINTHEAD WITH SELF-ALIGNED GROOVE AND RELATIVE MANUFACTURING PROCESS

This is a U.S. National Phase Application Under 35 USC 371 and applicants herewith claim the benefit of priority of PCT/IT01/00448 filed on Aug. 22, 2001, which was published Under PCT Article 21(2) in English, and of Application No. T02000A000813 filed in Italy on Aug. 23, 2000.

TECHNICAL FIELD

The invention relates to a printhead used in equipment or forming, through successive scanning operations, black and colour images on a print medium, usually though not exclusively a sheet of paper, by means of the thermal type ink jet technology, and to the relative manufacturing process.

BACKGROUND ART

Depicted in FIG. 1 is an ink jet colour printer on which the main parts are labelled as follows: a fixed structure 41, a scanning carriage 42, an encoder 44 and a variable number of printheads 40 which may be either monochromatic or colour.

The printer may be a stand-alone product, or be part of a photocopier, of a plotter, of a facsimile machine, of a machine for the reproduction of photographs and the like. The printing is effected on a physical medium 46, normally consisting of a sheet of paper, or a sheet of plastic, fabric or similar.

Also shown in FIG. 1 are the axes of reference:

x axis: horizontal, i.e. parallel to the scanning direction of the carriage 42; y axis: vertical, i.e. parallel to the direction of motion of the medium 46 during the line feed function; z axis: perpendicular to the x and y axes, i.e. substantially parallel to the direction of emission of the droplets of ink.

FIG. 2 shows an axonometric view of the printhead 40 according to the known art, on which nozzles 56, generally arranged in two columns parallel to the y axis, and a nozzle plate 106 are indicated.

The composition and general mode of operation of a printhead according to the thermal type technology, and of the "top-shooter" type in particular, i.e. those that emit the ink droplets in a direction perpendicular to the actuating assembly, are already widely known in the sector art, and will not therefore be discussed in detail herein, this description instead dwelling more fully on only those features of the heads and the head manufacturing process of relevance for the purposes of understanding this invention.

The current technological trend in ink jet printheads is to produce a large number of nozzles per head (≧300), a high definition (≧600 dpi), a high working frequency (≧10 kHz) and smaller droplets (≦10 pl) than those produced in earlier technologies.

Requirements such as these make it necessary to produce actuators and hydraulic circuits of increasingly smaller dimensions, greater levels of precision, and strict assembly tolerances. They also exasperate the problems generated by the different coefficients of thermal expansion among the different materials the head is made of.

Greater reliability is also required of the heads, especially where there is allowance for interchangeability of the ink tank: the service life of these heads, called semifixed refill heads, is close to that of the printers.

Thus there is a need to develop and produce fully integrated monolithic heads, in which the ink ducts, the selection microelectronics, the resistors and the nozzles are integrated in the "wafer".

Achievement of a result such as this is furthered by the small dimensions of the drops, now of volumes less than 10 pl (pl=picolitre), and which require actuation energies of less than 3 $\mu$j ($\mu$j=microjoule) per actuator.

Numerous solutions for producing heads with a monolithic actuator have been proposed, such as for instance the one described in the Italian patent application TO 99A 000610 "Monolithic Printhead and Associated Manufacturing Process".

FIG. 3 depicts, by means of an axonometric view and a cross-section, a monolithic actuator 80 comprising:

a die 61 of semiconductor material, generally silicon;

a structure 75 made of a layer of, for instance, polyamide or epoxy resin, having thickness preferably between 20 and 50 $\mu$m;

the nozzles 56 arranged in two columns parallel to the y axis.

In the same figure, in an enlarged section AA, parallel to the plane z-x, the following may be seen:

chambers 57, arranged in two columns parallel to the y axis;

ducts 53;

a substrate 140 of silicon P;

a groove 45, having its greater dimension parallel to the y axis, and accordingly also to the columns of nozzles 56;

a lamina 64, which in turn comprises:

a diffuse layer 36 of N-well silicon an insulating layer 35 of LOCOS $SiO_2$;

a resistor 27 of tantalum/aluminum having a thickness of between 800 and 1200 Å;

a layer 34 of polycrystalline silicon;

a contact 37 of N+ silicon;

an "interlayer" 33 of BPSG;

an "interlayer" 32, consisting of a layer of TEOS $SiO_2$;

a layer 30 of $Si_3N_4$ and SiC for protection of the resistors;

channels 67;

an anti-cavitation layer 26, made of a layer of tantalum covered by a layer of gold;

ink 142; and a droplet of ink 51.

According to the patent application cited, the groove 45 is produced in part in a "dry etching" step and in part in a "wet etching" step, both known to those acquainted with the sector art. The wet etching proceeds according to geometrical planes defined by the crystallographic axes of the silicon, which set the orientation of the groove 45 along the x-y plane. To be able to produce the columns of nozzles 56 parallel to the groove 45, there is therefore the need to dispose of references accurately aligned to the crystallographic axes of the silicon: with the aid of FIGS. 4 and 5, a procedure commonly followed for this purpose is described.

A circular shaped wafer 66 commonly has a reference 65, called "flat" by those acquainted with the sector art, oriented perpendicularly to one of the crystallographic axes of the silicon, with an error angle $\epsilon$ generally contained within ±1°. A geometric reference 63 is constructed perpendicular to the flat 65. The groove 45, etched in a wet process, will on the other hand be parallel to the crystallographic axis of the silicon, and thus rotated by the angle $\epsilon$ with respect to the geometric reference 63. If the columns of nozzles 56 were oriented parallel to the geometric reference 63, they would not be parallel to the groove 45, thereby compromising operativity of the head.

This makes it necessary to construct a crystallographic reference 62 (FIG. 5) which is parallel to the actual crystallographic axis of the silicon. One way of constructing such a reference is described, for example, in the article "Alignment of Mask Patterns to Crystal Orientation" by G. Ensell presented to the 8th International Conference On Solid-State Sensors and Actuators, Stockholm, Jun. 25–29, 1995.

To this end, various test notches 55 are etched, of circular shape and arranged according to an arc of a circle with centre C. Then a wet etching is performed which, local to each notch, produces a square-shape subetching having sides parallel to the crystallographic axes of the silicon. Generally the sides of the subetchings of two notches, indicated with a and b, happen to belong to one and the same straight line: the crystallographic axis sought is perpendicular to the radius r which joins a median point between a and b with C, and becomes visible when the crystallographic reference 62 is plotted, parallel to which the columns of the resistors 27 and of the corresponding nozzles 56 are aligned.

The process described enables to reduce the error angle $\epsilon$ for example to within ±0.1°, but is highly complex. It also requires that the mask defining the groove, which is necessarily on the face of the wafer that contains the crystallographic reference 62, be aligned to the masks which define the other parts of the actuator, which are on the opposite side of the wafer.

Methods have therefore been proposed by means of which it is possible to etch the groove 45 in such a way that the latter aligns automatically to a desired reference, such as for instance to the columns of the nozzles 56, even if the crystallographic axis of the silicon has a slightly different orientation. One of these methods is described for instance in the article "A Thermal Inkjet Printhead with a Monolithically Fabricated Nozzle Plate and Self-Aligned Ink Feed Hole" published in the Journal of Microelectromechanical Systems, Vol. 8, No. 3, September 1999, and is herein described summarily with the aid of FIG. 6, where a wafer of semiconductor material is depicted in section. The following are labelled:

- a substrate 140 of silicon P;
- an insulating layer 35 of LOCOS $SiO_2$;
- a metallic layer 71, made for instance of Au;
- a contact 37 of silicon P+ having the purpose of improving the electrical connection between the metallic layer 71 and the substrate 140 of silicon P;
- an N diffusion, 38
- an electrolyte 82; and
- a cathode 81, made of a conducting material resistant to the electrolyte 82, of platinum for instance.

On applying a voltage V between the cathode 81 and the metallic layer 71 a current field flows, indicated by the field lines 52, which assumes a shape defined with precision by the geometry of the insulating layer 35 of LOCOS $SiO_2$ and by the silicon P+ contact 37. The substrate 140 of silicon P is etched electrochemically local to the field lines 52 until the metallic layer 71 is reached. In this way the electrochemical grooves 68 are made (FIG. 7*a*) which, in the vicinity of the metallic layer 71, assume the shape and orientation defined with precision by the geometry of the insulating layer 35 and by the silicon P+ contact 37, totally independent of the orientation of the crystallographic axis of the silicon.

The electrochemical etching also has the advantage of being fast (from 20 to 30 μm per minute), much faster than wet anisotropic etching (from 0.5 to 1 μm per minute) and ICP dry etching (from 5 to 10 μm per minute).

The electrochemical grooves 68, however, have extremely rounded edges which increase their length on the side facing the cathode 81, which will be turned towards the ink tank during operation: when the different grooves 68 are close together, as is the case in colour heads with a large number of nozzles, the silicon between them is excessively diminished, and no longer has a flat surface coplanar with the edges of the die, rendering a subsequent sealing operation difficult. Also in a monochromatic head, which has a single groove as can be seen in FIG. 7*b*, the edges of the die are rounded rendering the sealing operation difficult.

DISCLOSURE OF INVENTION

The object of this invention is to produce a monolithic head in which the grooves are self-aligned with precision to the columns of resistors and nozzles.

Another object is to avoid the process of making the crystallographic reference.

Another object is to avoid the procedure of precision alignment to the crystallographic reference, instead using only the geometric reference.

Yet another object is to produce the grooves with well-defined edges at the ink feeding side.

Another object is to make the grooves with edges parallel to the columns of resistors.

A further object is to produce the grooves with edges of limited and precise dimensions on the ink feeding side.

Another object is to produce the grooves without diminishing the silicon between any two of the same.

A further object is to have flat and coplanar surfaces between the grooves and on the edges of the die, ensuring correct sealing without needing to increase die dimensions.

Another object is to perform the last groove etch step in a short time, close in duration to that of the other steps of the production process, so as not to slow down the production flow or avoid use in parallel of numerous and burdensome equipment.

A further object is to produce a first portion of the etch of the groove that allows an intermediate storage of the semi-processed wafers.

These and other objects, characteristics and advantages of the invention will become apparent from the following description of a preferred embodiment, provided purely by way of non-restrictive example, with reference to the accompanying drawings.

BEST MODE FOR CARRYING OUT THE INVENTION

Figure 1:
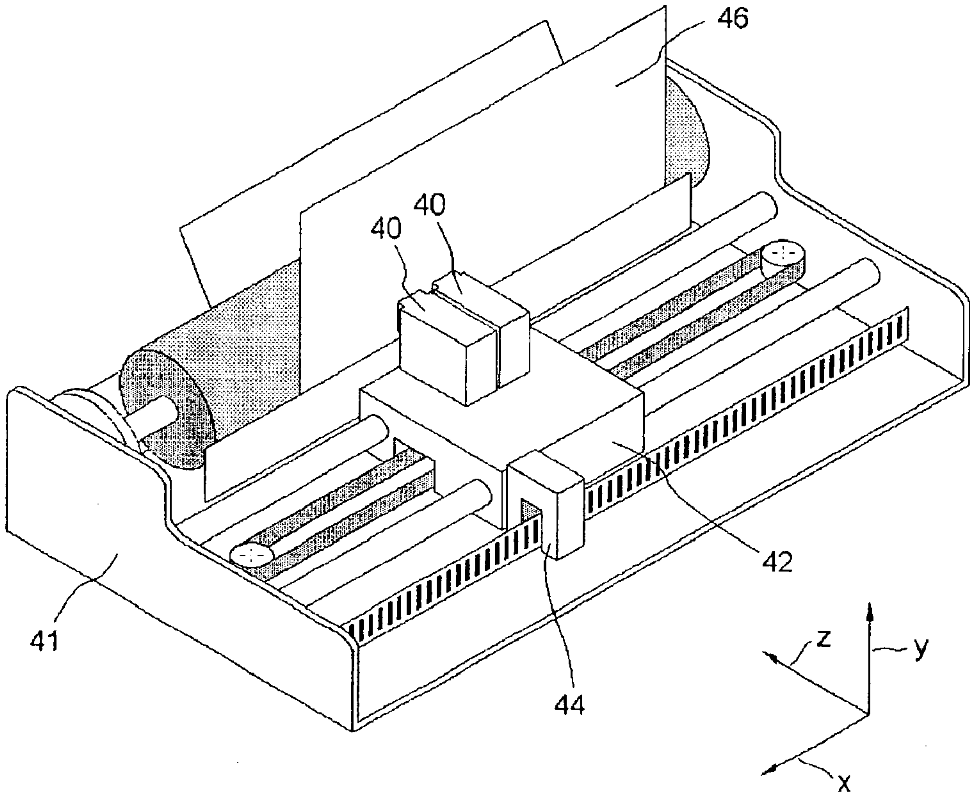
FIG. 1—represents an axonometric view of an ink jet printer.
Figure 2:
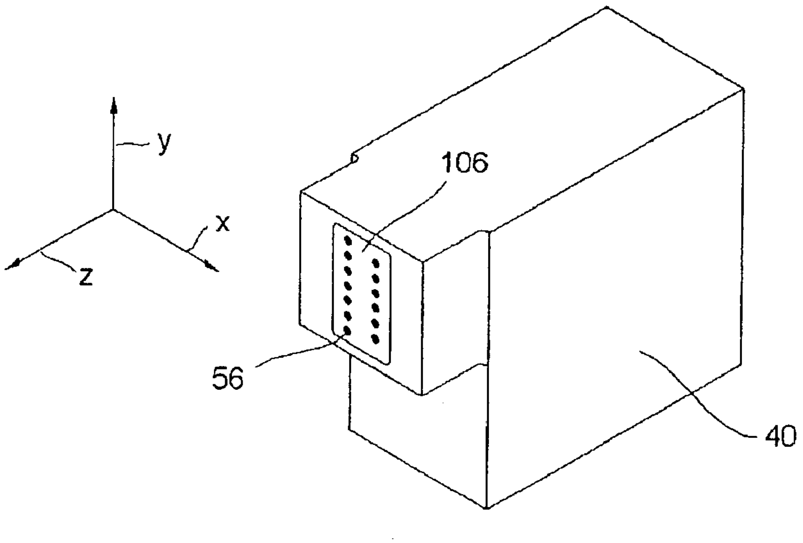
FIG. 2—represents an axonometric view of an ink jet head.
Figure 3:
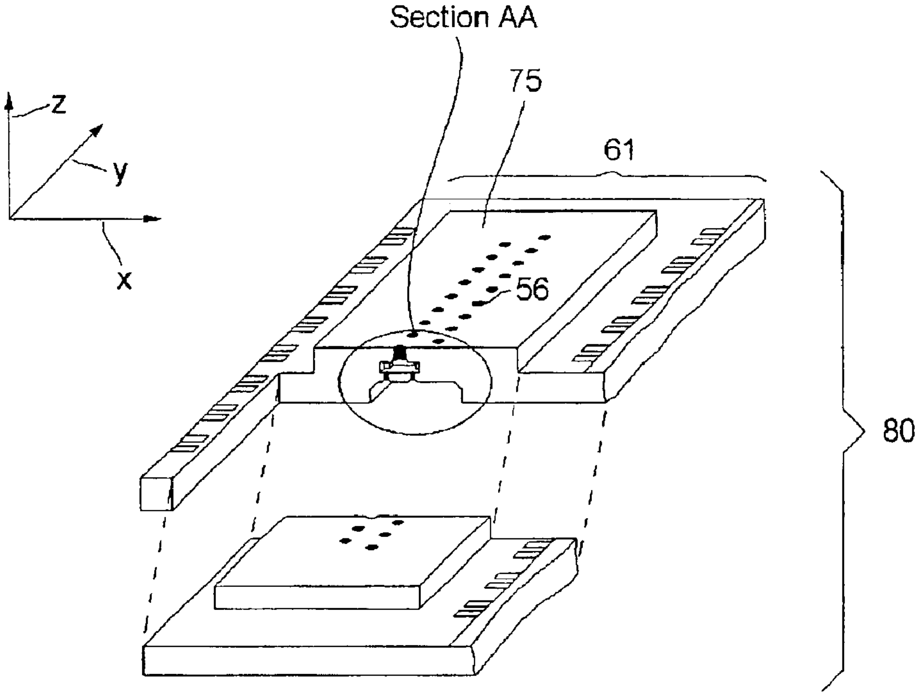
FIG. 3—represents an axonometric view and a section view of an actuator of a monolithic head, according to the known art.
Figure 3:
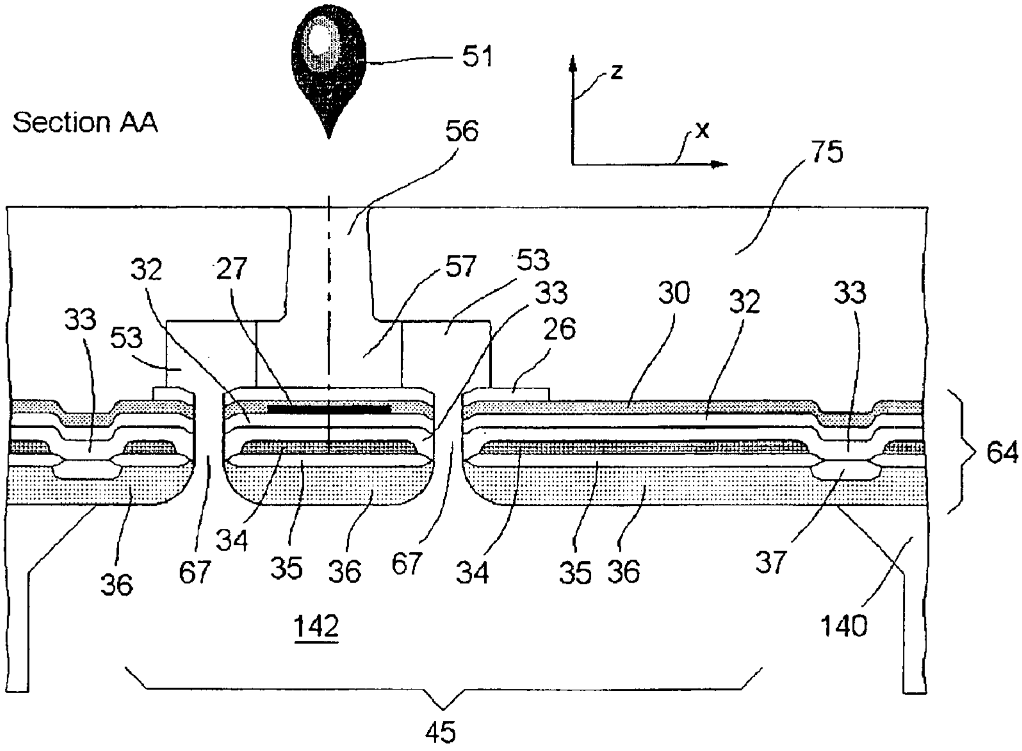
Figure 4:
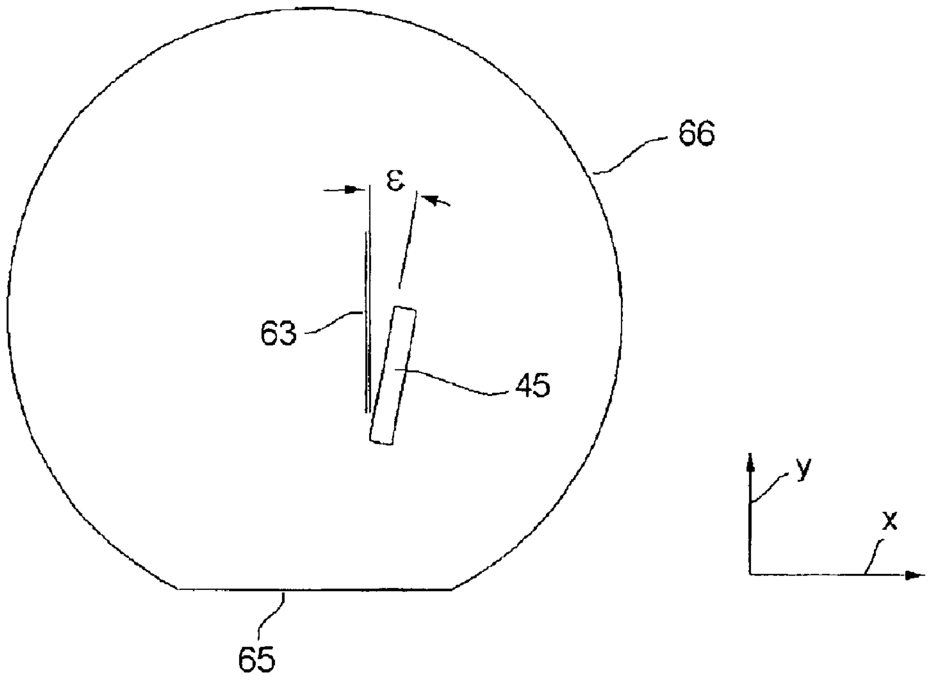
FIG. 4—represents a wafer of semiconductor material, provided with an orienting flat.
Figure 5:
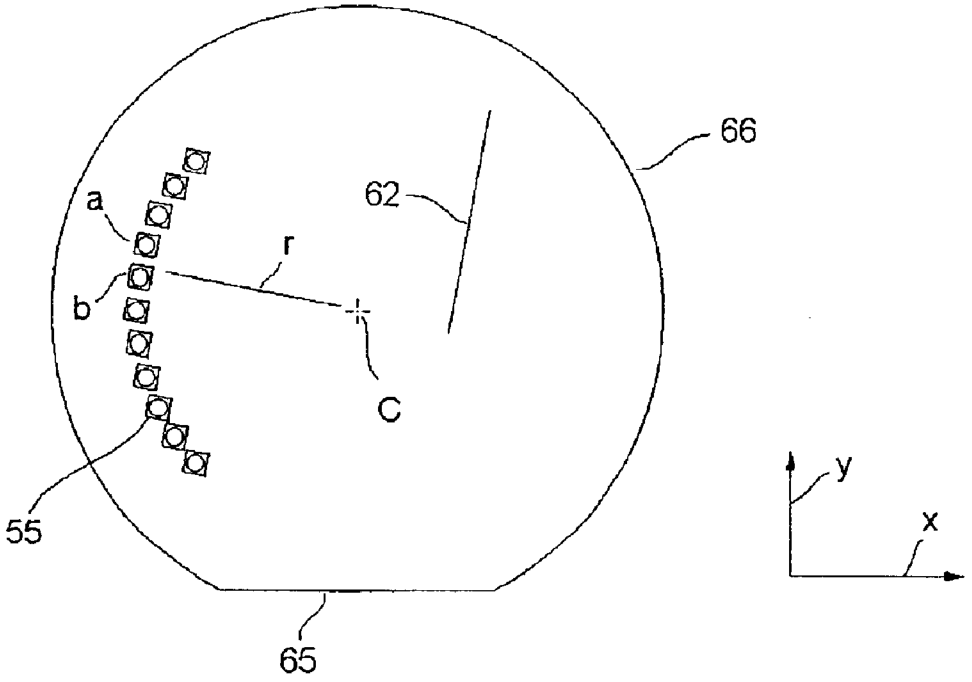
FIG. 5—represents a wafer of semiconductor material, in which test notches have been made.
Figure 6:
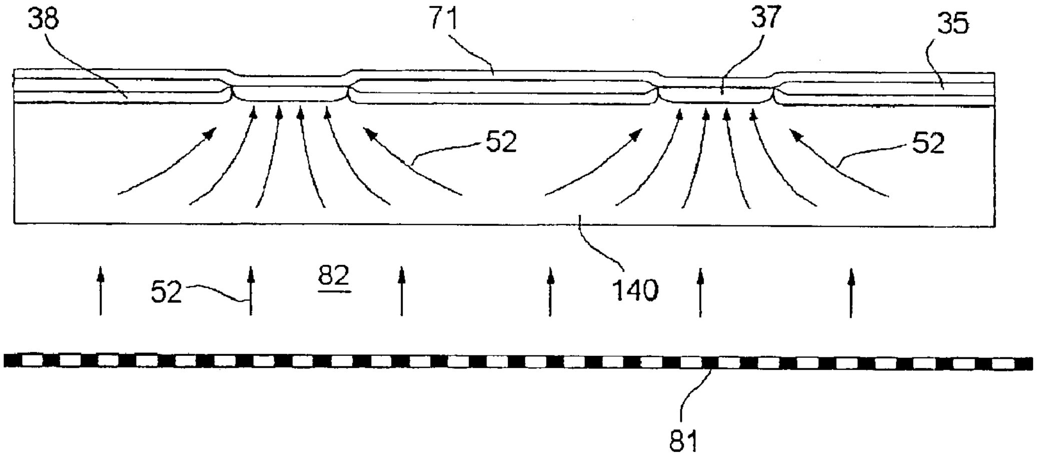
FIG. 6—represents a section of a wafer of semiconductor material, in which an electrochemical etch is made according to the known art.
Figure 7A:
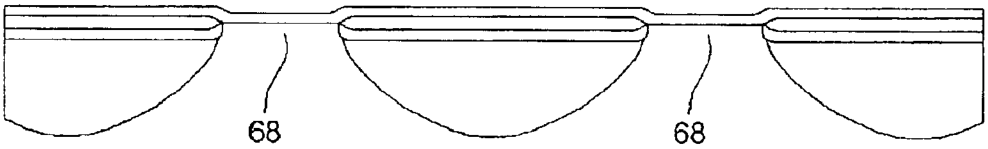
FIG. 7*a*—represents the section of the wafer of FIG. 6 as it appears at the end of the electrochemical etching according to the known art.
Figure 7B:
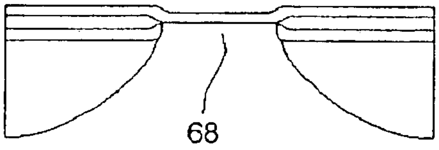
FIG. 7*b*—represents the section of a monochromatic die as it appears at the end of the electrochemical etching according to the known art.
Figure 8:
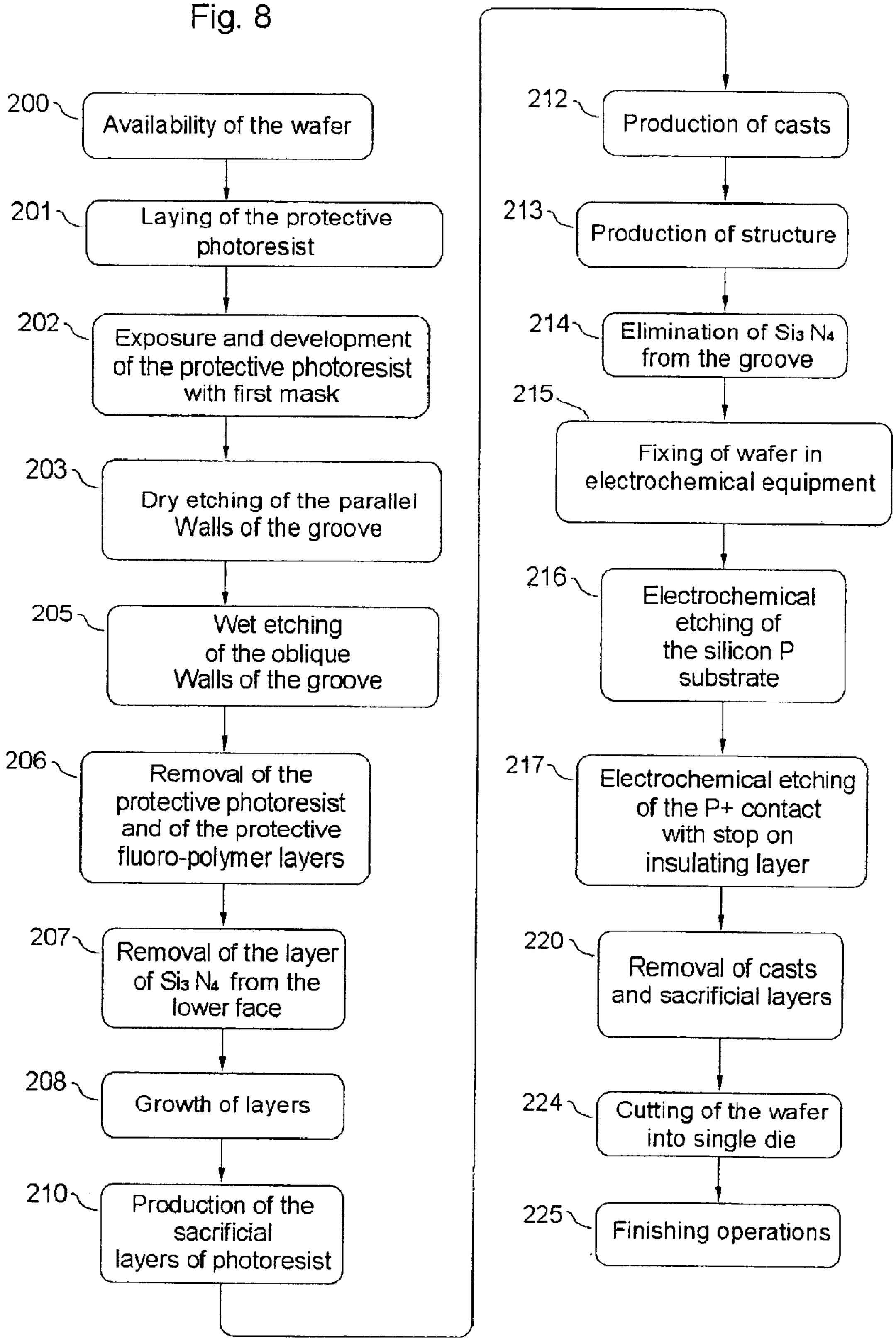
FIG. 8—illustrates the flow diagram of the manufacturing process according to the invention.

The manufacturing process of a monolithic actuator for printhead with self-aligned groove is now described, with the aid of the flow diagram of FIG. 8.

Figure 9:
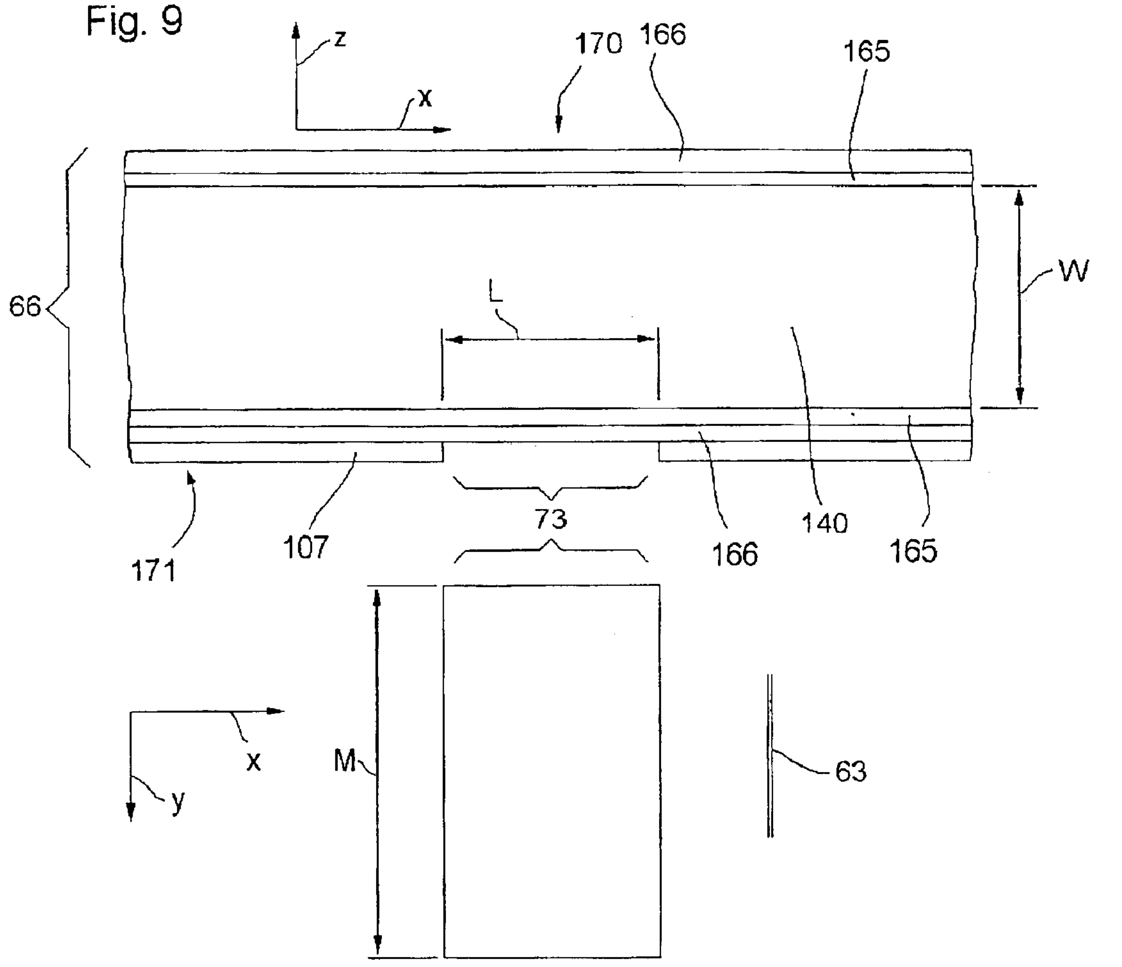
FIG. 9—illustrates a section of an actuator at the start of the manufacturing process according to the invention.

In a step 200, a wafer 66 of silicon is prepared, a portion of which can be seen in a section parallel to the plane x-z in FIG. 9, consisting of a substrate 140 of silicon P having a thickness W for instance of 625 μm, a resistivity preferably between 0.1 and 0.2 Ω·m and oriented crystallographic axes {100}. The wafer 66 has an upper face 170 and a lower face 171, upon which two layers 165 of Si3N4 are produced with the LPCVD (Low Pressure Chemical Vapour Deposition) technology known to those acquainted with the sector art, of thickness preferably between 1000 and 2000 Å. Above the layers 165 of $Si_3N_4$ two protection layers 166 of a fluoropolymer are deposited, of Cytop for instance produced by the Asahi Glass Company, having a thickness for example of 2 μm.

The wafer 66 also features the geometric reference 63, visible in the projection parallel to the x-y plane.

In a step 201 a layer 107 of photoresist is deposited on the lower face 171 of the wafer, between 4 and 5 μm thick for example.

In a step 202, again described with the aid of FIG. 9, by means of exposure and development operations that use a first mask not depicted in any of the figures, a rectangular aperture 73 is made in the layer 107 of photoresist, of a width L parallel to the x axis and between 400 and 600 μm, for instance, and a length M, parallel to the y axis and generally between 4 and 25 mm.

The rectangular aperture 73 is aligned in such a way that its sides of length M are parallel to the geometric reference 63.

Figure 10:
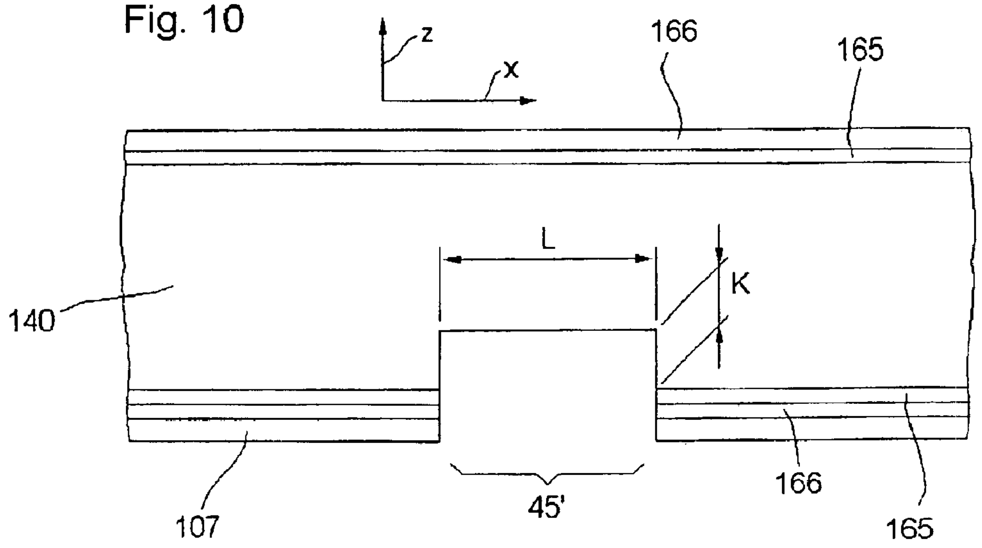
FIG. 10—illustrates a section of the actuator after the dry etching step.

In a step 203, described with the aid of FIG. 10, an etching is made by means of the dry technology, known to those acquainted with the sector art, of the protection layer 166, of the layer 165 of $Si_3N_4$, and of a part of the substrate 140 of silicon P to a depth K, for instance of 200 μm, using as the mask the rectangular aperture 73, and using, for each layer, a corresponding gas and equipment, according to a technology known to those acquainted with the sector art.

This etching, indicated with the numeral 45', has two walls parallel to the y-z plane and constitutes a first part of the future groove 45, which accordingly assumes precise, delimited dimensions.

Figure 11:
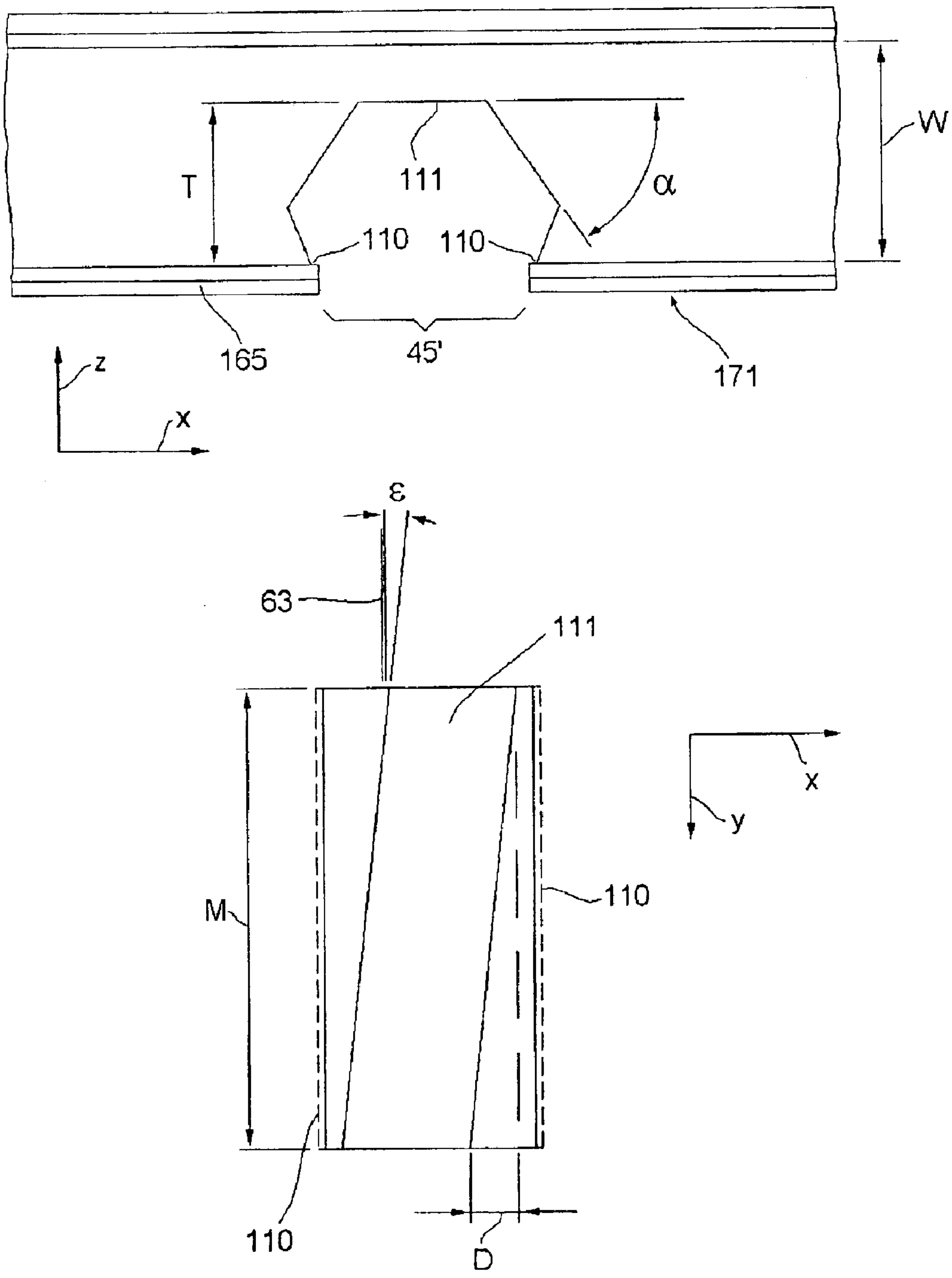
FIG. 11—illustrates a section of the actuator after the wet etching step.

In a step 205, etching of the groove 45' continues by means of a wet technology, which uses KOH or TMAH for instance, as is known to those acquainted with the sector art. Etching of the groove 45' proceeds according to geometric planes defined by the crystallographic axes of the silicon, as illustrated in FIG. 11, and therefore forms an angle $\alpha$=54.7° with respect to the x axis. At the end of the wet etching, the groove 45' reaches a depth T, of for instance 400 μm The wet etch partially attacks the parallel walls of the dry etching as well, making them divergent, and produces a "subattack" under the layer 165 of $Si_3N_4$, following which corners 110 result.

As the wet etching of the groove 45' proceeds according to geometric planes defined by the crystallographic axes of the silicon, the bottom 111 of the groove 45' is practically never perfectly aligned to the geometric reference 63, but generally exhibits the error angle $\epsilon$ and as a result a misalignment D between its extremities, as may be seen in the bottom part of FIG. 11 which represents the groove 45' seen from the lower face 171.

The misalignment D can easily assume unacceptable values: if for example the length M is equal to half an inch (12.7 mm) and the error angle $\epsilon$ is equal to 0.5°, we obtain:

$$D=M\cdot\tan\epsilon=12.7\ \text{mm}\cdot 0.0087=111\ \mu\text{m}$$

As the resistors 27 are located approximately at about 100 μm from the bottom of the groove 45, a misalignment D of 111 μm is intolerable.

Alternatively arrangements may be made to use a wafer selected with error $\epsilon$ limited for instance to 0.25°. If the length M is maintained at 12.7 mm, we obtain D =55 μm, which is still unacceptable.

Even when we produce the crystallographic reference 62, which allows the error $\epsilon$ to be reduced to within 0.1°, but the length M is great, for example of 1 inch (25,4 mm), the misalignment obtained is still unacceptable:

$$D=M\cdot\tan\epsilon=25.4\ \text{mm}\cdot 0.0017=44\ \mu\text{m}$$

The corners 110, on the other hand, are aligned to the geometric reference 63 parallel to the column of resistors 27, as the first mask was aligned in this way.

Progress of the wet etching is somewhat slow (from 0.5 to 1 μm per minute) but this does not constitute a drawback in this step, as many wafers can be processed simultaneously in a single bath, using a process stop dictated by time, depth T of the etch not being critical.

In a step 206 any residues of the layer 107 of photoresist and the two protection layers 166 of fluoro-polymer are removed, using a known plasma etching process, in oxygen for example.

In a step 207 the LPCVD layer 165 of $Si_3N_4$ on the lower face 171 is removed using a plasma etching, for instance, in $CF_4$. On the other hand, the layer 165 on the upper face 170 is left. Alternatively this step 207 may be omitted.

Figure 12:
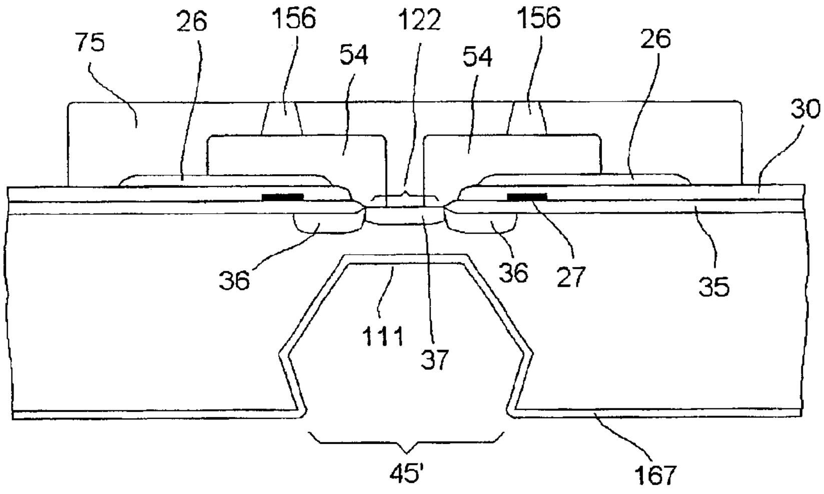
FIG. 12—illustrates a section of the actuator after the production of a structure and sacrificial layers.

In a step 208 the layers indicated in FIG. 12 are produced:

an N-well layer 36, of thickness preferably between 2 and 5 $\mu$m;

a layer 167 of LPCVD $Si_3N_4$ on the lower face 171, made together with a similar layer on the upper face 170, used as the mask and not seen in the figure since it is subsequently eliminated;

the insulating layer 35 of $SiO_2$ of thickness preferably between 0.8 and 1.5 $\mu$m, made for example by means of the LOCOS technology, known to those acquainted with the sector art; this layer has a rectangularly shaped window 122, having its greater side aligned with precision parallel to the geometric reference 63, produced using as the mask the layer of LPCVD $Si_3N_4$ on the upper face 170, subsequently eliminated;

a layer 37 of silicon P+, of thickness preferably between 0.25 and 1 $\mu$m, which occupies the window 122;

the tantalum/aluminum resistors 27;

the layer 30 of $Si_3N_4$ and SiC for protection of the resistors 27, of thickness preferably between 0.25 and 1 $\mu$m and produced with the PECVD (Plasma Enhanced Chemical Vapour Deposition) technology known to those acquainted with the sector art; and the anti-cavitation layer 26, made of a layer of tantalum of thickness preferably between 0.25 and 0.6 $\mu$m. The different segments comprising the anti-cavitation layer 26 may be interconnected through all of the wafer, in such a way as to form a single equipotential surface, as was described in the patent application TO 99A000987 "Monolithic Printhead with Built-in Equipotential Network and Associated Manufacturing Method". In this way, during the work steps involving electrochemical processes, the anti-cavitation layer 26 may be used as an equipotential electrode, simply by connecting one or several of its points to a desired potential.

The anti-cavitation layer 26 is interrupted by an aperture that includes the window 122, but it is electrically connected to the layer 37 of silicon P+ by means of conducting "vias", not shown in any of the figures.

In a step 210, again described with reference to FIG. 12, sacrificial layers 54 are made, preferably between 10 and 25 $\mu$m thick, and preferably made of positive photoresist, of the AZ 4903 type produced by Hoechst or SPR 220 by Shipley for instance;

In a step 212, casts 156 are made, having the same shape as the future nozzles 56, preferably truncated cone shape, also preferably made of positive photoresist, of the AZ 4903 type produced by Hoechst or SPR 220 by Shipley for instance. The manufacturing characteristics and function of the casts 156 are described in detail in the patent application TO 2000A000526 "Process for Manufacturing a Monolithic Printhead with Truncated Cone Shape Nozzles".

The two steps 212 and 213 may be carried out with a single application of photoresist and a double exposure.

In a step 213 a structure 75 is made, which may be made of negative photoresist, either epoxy type (for example, EPON SU-8 by Micro Chemical Corporation) or polyamide (for example, Probimide 7020 by Olin Hunt).

In a step 214 the layer 167 of LPCVD $Si_3N_4$ made on the lower face 171 and on the inside of the groove 45' during the step 207 is removed, with particular attention being paid to removing it from the bottom 111.

Figure 13:
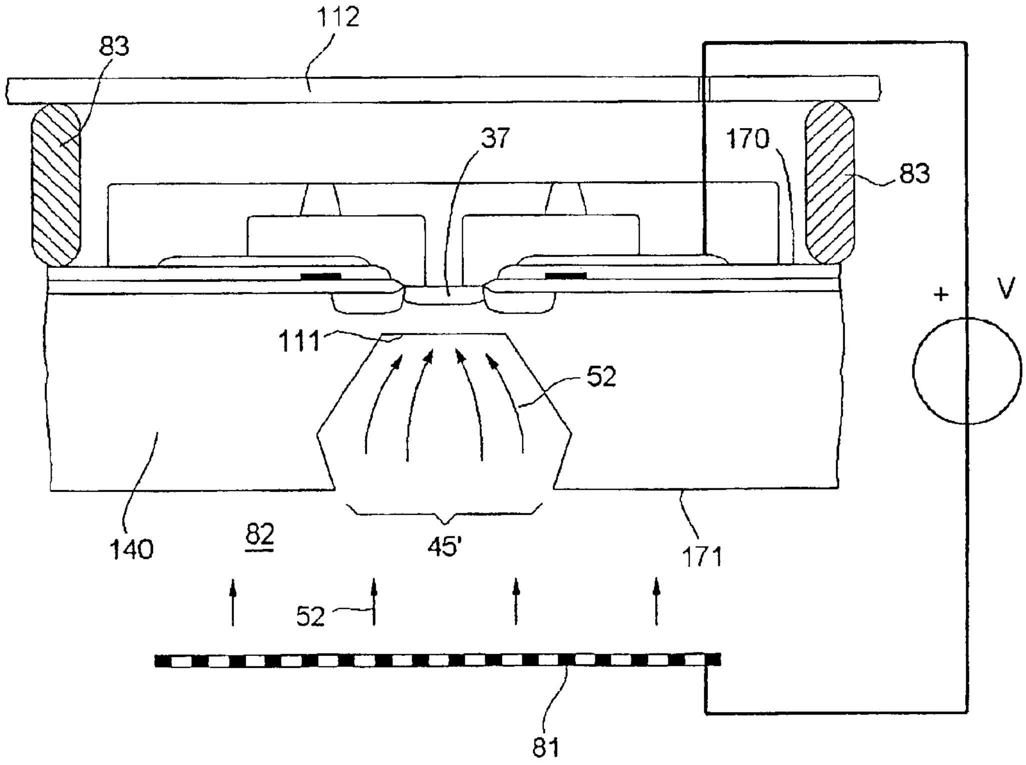
FIG. 13—illustrates a section of the actuator ready for the electrochemical etching step.

In a step 215, described with reference to FIG. 13, the wafer is mounted on equipment consisting of a clamping tool 112, of teflon for instance. A toroid seal 83, visible in section, is placed between the clamping tool 112 and the upper face 170 of the wafer. The entire assembly is immersed in the electrolyte 82, consisting for instance of a solution of $HNO_3$ and HF in $H_2O$. The cathode 81, made of platinum for example, is immersed in the electrolyte 82.

In a step 216, again described with reference to FIG. 13, the d.c. voltage V is applied between the cathode 81 and the anti-cavitation layer 26, with the positive polarity on the latter. It will be recalled that the anti-cavitation layer 26 may form a single equipotential surface interconnected all through the wafer, and may accordingly function as an equipotential electrode, simply by connecting one or several of its points to the positive polarity of V. The anti-cavitation layer 26 is, in addition, connected electrically to the layer 37 of silicon P+.

In this way, a current field is established, indicated by the field lines 52, which traverses the groove 45' and the substrate 140 of silicon P, producing an electrochemical etching of the bottom 111, which is progressively removed until the layer 37 of silicon P+ is reached.

Figure 14:
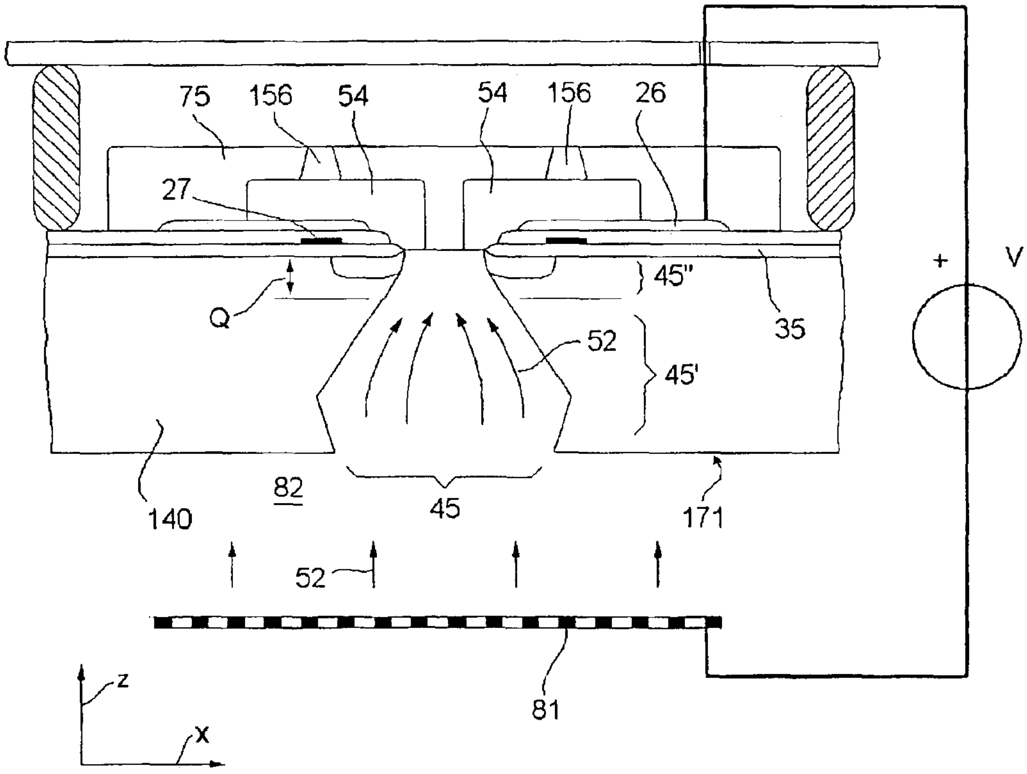
FIG. 14—illustrates a section of the actuator during the electrochemical etching step.

In a step 217, described with reference to FIG. 14, the electrochemical etching of the layer 37 of silicon P+ continues, until reaching the structure 75 and the sacrificial layers 54 which, as they are made of insulating material, stop the process.

This terminates the etching of a end portion 45" by way of completion of the groove 45. The end portion 45" has a depth Q of about 200 $\mu$m and is etched in about 10 minutes; it still has converging walls, which generally form an angle different from $\alpha$.

During this step, the walls of the portion 45' of the groove are also partially eroded, but this does not alter the functionality of the groove 45. The lower face 171 and the edges that this forms with the groove 45 are not eroded to any appreciable extent, the structure of silicon between adjacent grooves therefore remains unaltered.

The shape and orientation of the end portion 45" are defined with exactness by the geometry of the N-well layer 36, of the layer 37 of silicon P+, which conveys on itself the current field, and of the window 122 in the LOCOS layer 35. In this way, the length along the y axis of the end portion 45" is exactly aligned to the geometric reference 63, not shown in this figure, and therefore to the columns of resistors 27 and of the corresponding nozzles 56, in a way completely independent of the error angle $\epsilon$.

When the layer 37 of silicon P+ is almost completely eliminated, some of its residues may remain electrically separated from the "vias" of connection with the anti-cavitation layer 26, and therefore, no longer being traversed by current, they are not eliminated by the electrochemical etching. In this case, a further wet or dry etching may be necessary to completely eliminate each residue of the layer 37 of silicon P+.

Figure 15:
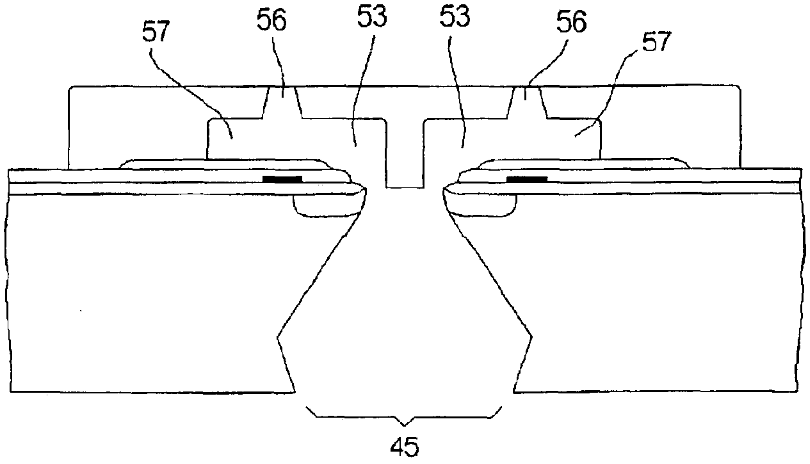
FIG. 15—illustrates a section of the finished actuator.

In a step 220, described with reference to FIG. 15, removal is effected of the casts 156 and of the sacrificial layers 54 of positive photoresist by means of a bath in a solvent suitable for the photoresist and which does not attack the structure 75. Turnover of the solvent may be furthered by ultrasound agitation or by a spray jet. Following this operation the nozzles 56 are obtained, the shape of which is exactly that of the casts 156, as described in the already cited Italian patent application TO 2000A 000526, and the ducts 53 and the chambers 57 are also obtained, shaped exactly like the sacrificial layers 54.

In a step 224, the wafer 60 is cut into the single dice 61 by means of a diamond wheel, not shown in any of the figures.

Finally in a step 225, the finishing operations, well-known to those acquainted with the sector art, are carried out.

2nd Embodiment

This embodiment is described with reference again to the flow diagram of FIG. 8. It involves execution of the same steps as already described for the preferred embodiment, except for step 205, wet etching of the oblique walls of the groove 45.

Figure 16:
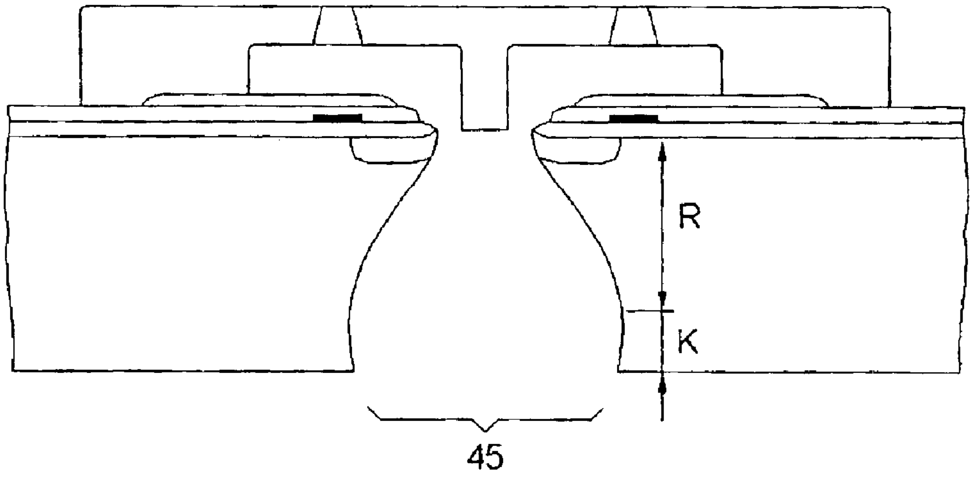
FIG. 16—illustrates a section of an actuator in a second embodiment.

In this way, at the start of step 216, electrochemical etching of the substrate of silicon P, on the lower face 171 there is only the "dry" groove of depth K, of 200 μm for instance, as indicated in FIG. 16. The electrochemical etching must therefore proceed for a depth R, for instance of 400 μm, and has a duration for instance of 20 minutes.

3rd Embodiment

Figure 17:
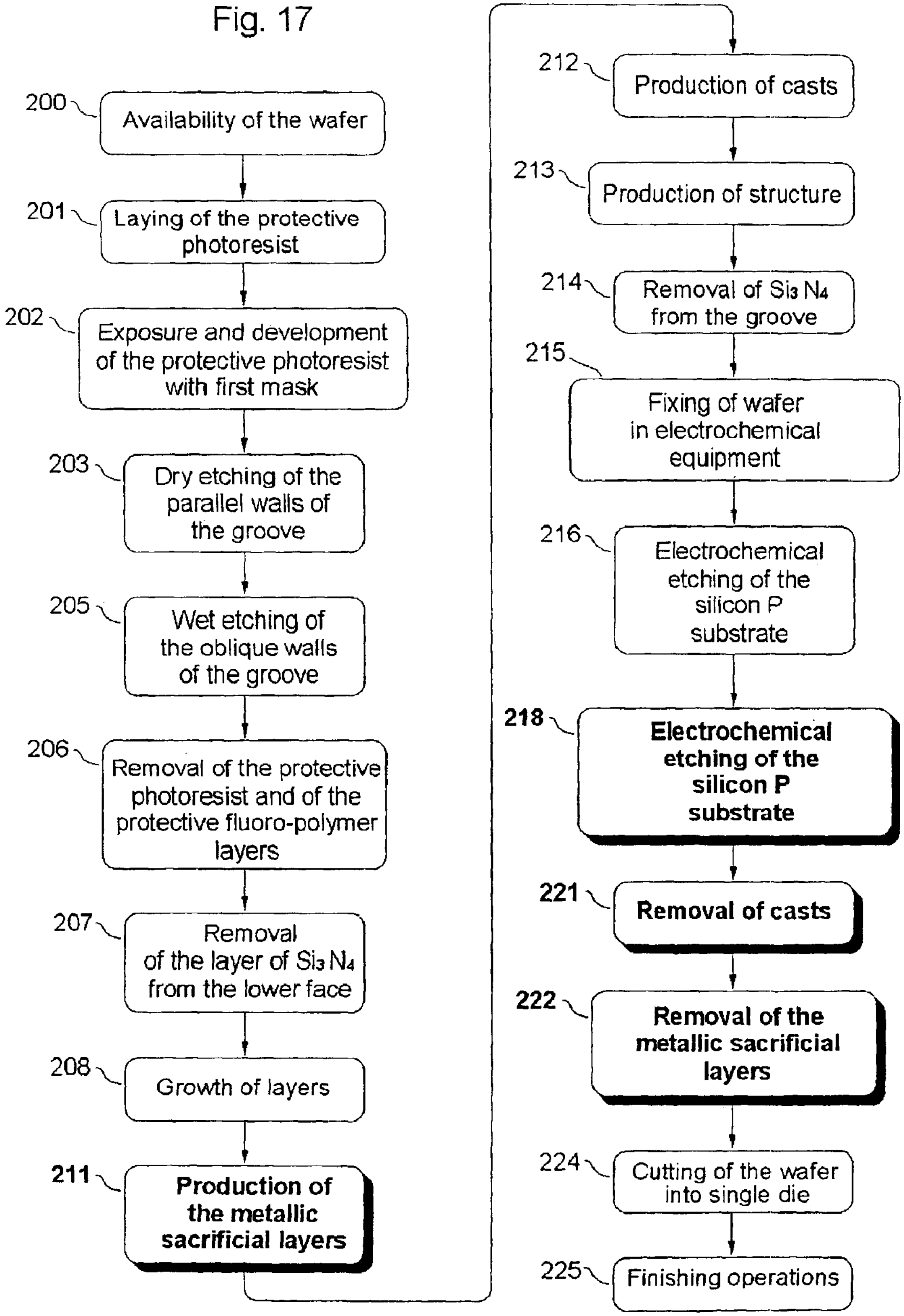
FIG. 17—illustrates the flow diagram of a manufacturing process according to a third embodiment.

This embodiment is described with the aid of the flow diagram of FIG. 17, which differs from the similar flow diagram of FIG. 8 in that the step 210 is substituted by a step 211, the step 217 is substituted by a step 218, and the step 220 is substituted by steps 221 and 222. In FIG. 17 the new steps are represented in bold type.

Figure 18:
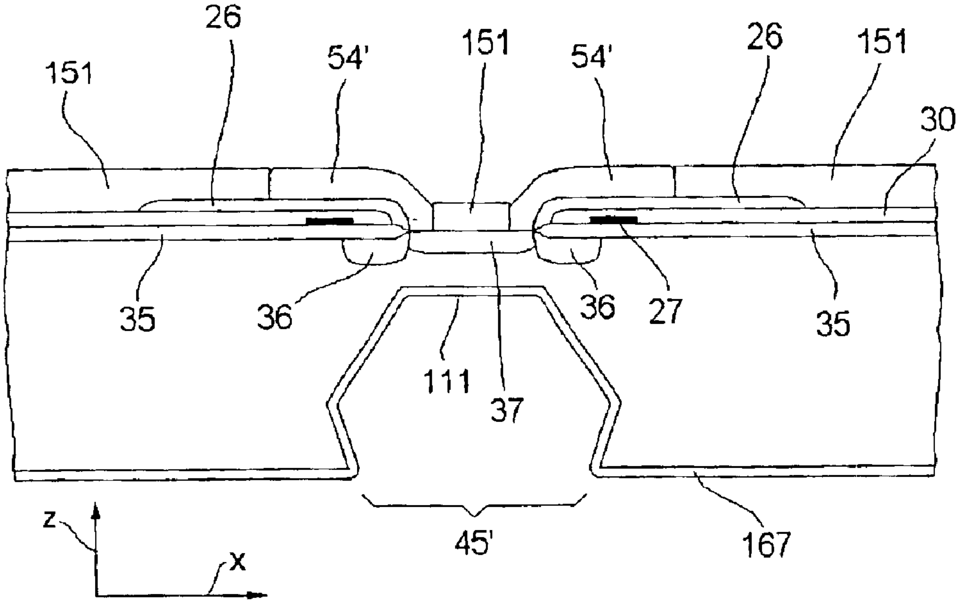
FIG. 18—illustrates a section of the actuator according to the third embodiment, after the steps of dry etching, wet etching and production of a structure and sacrificial layers.
Figure 18:
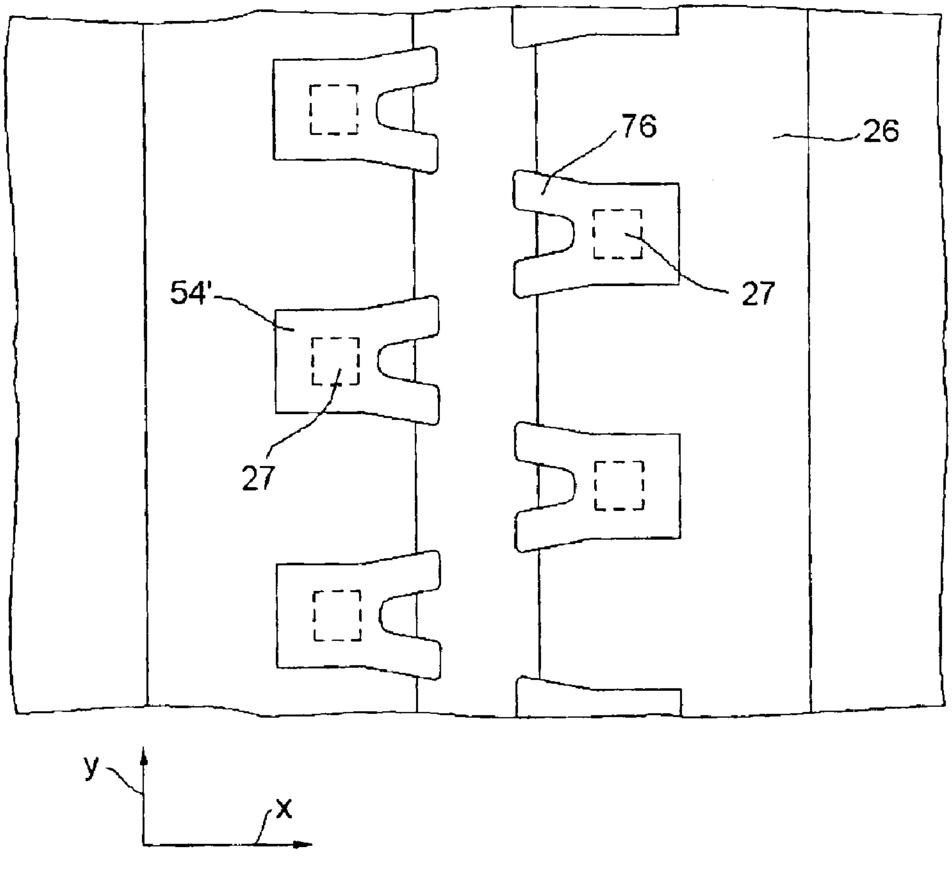

In the step 211, sacrificial layers 54' of a metal, for instance copper, are made; in this step of the work, the section of a die is as illustrated in FIG. 18.

The sacrificial layers 54' are preferably between 10 and 25 μm thick, and are made in an electrochemical growth process such as the one described in the cited Italian patent application TO 99A 000610. The electrochemical growth can use as the electrode the anti-cavitation layer 26, as described in detail in the cited Italian patent application TO 99A 000987. An upper layer 151 of photoresist is used as the mould for the growing of the metallic sacrificial layers 54'.

The silicon P+ layer 37 which, with its own shape will determine the shape of the end portion 45" of the groove 45, is still visible in FIG. 18.

The anti-cavitation layer 26 can act as an equipotential electrode, connecting one or more of its points to the positive polarity of V, as it forms a single equipotential surface interconnected through the whole wafer, and is also electrically connected to the layer 37 of silicon P+.

In this embodiment, the anti-cavitation layer 26 has a window coincident with the window 122 in the insulating layer 35 of LOCOS $SiO_2$, and is also covered by a layer of gold of thickness preferably between 100 and 200 Å, not visible in any of the figures, the function of which is to act as "seed layer" for the metallic sacrificial layers 54', as described in the cited Italian patent application TO 99A 000610.

In the bottom part of FIG. 18 the metallic sacrificial layers 54' can be seen on the x-y plane: they have protuberances 76 in contact with the layer 37 of silicon P+, obtained partly by exploiting the phenomenon of lateral growth of the metallic sacrificial layers 54', known to those acquainted with the sector art.

Next the already described steps 212, 213, 214, 215 and 216 are carried out.

Figure 19:
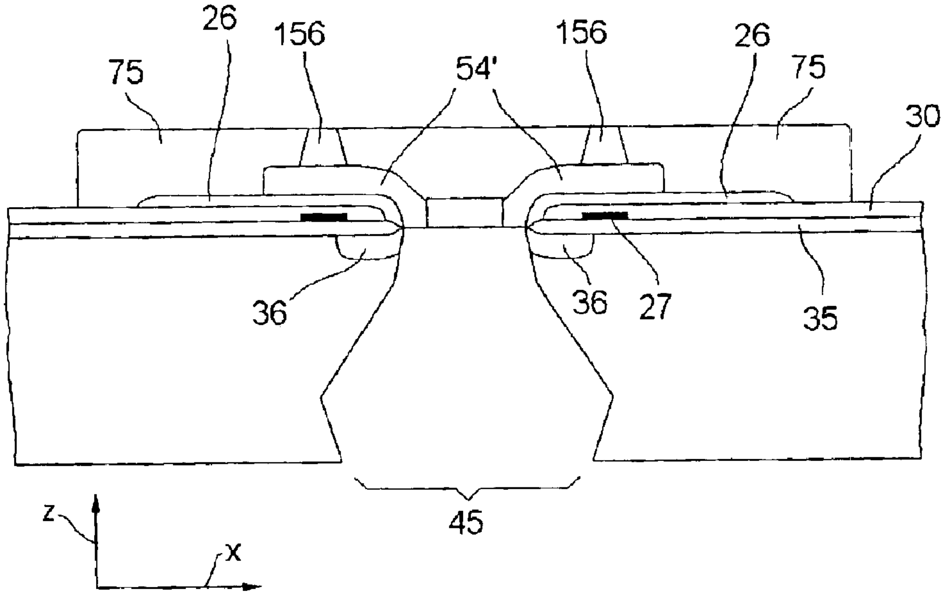
FIG. 19—illustrates a section of the actuator according to the third embodiment after the electrochemical etching step.
Figure 19:
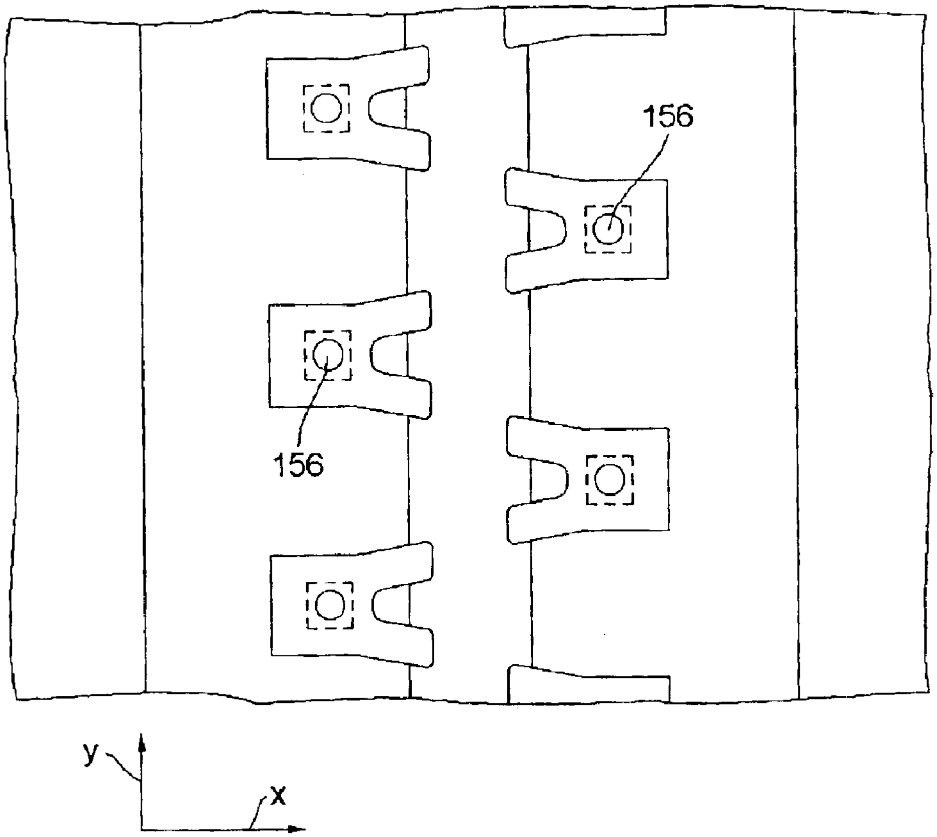

In the step 218, the electrochemical etching of the layer 37 of silicon P+ continues until the structure 75 and the sacrificial layers 54' are reached. The latter, being made of conducting material, do not automatically stop the process and are in turn etched: this does not constitute a problem as the sacrificial layers 54' will still be eliminated in a successive step of the process, but it does require a stop to be arranged in the electrochemical etching, for example on a time basis. At the end of this step, the die in process looks as illustrated in the sections of FIG. 19.

A further wet or dry etching may be necessary to fully eliminate each residue of the layer 37 of silicon P+.

Figure 20:
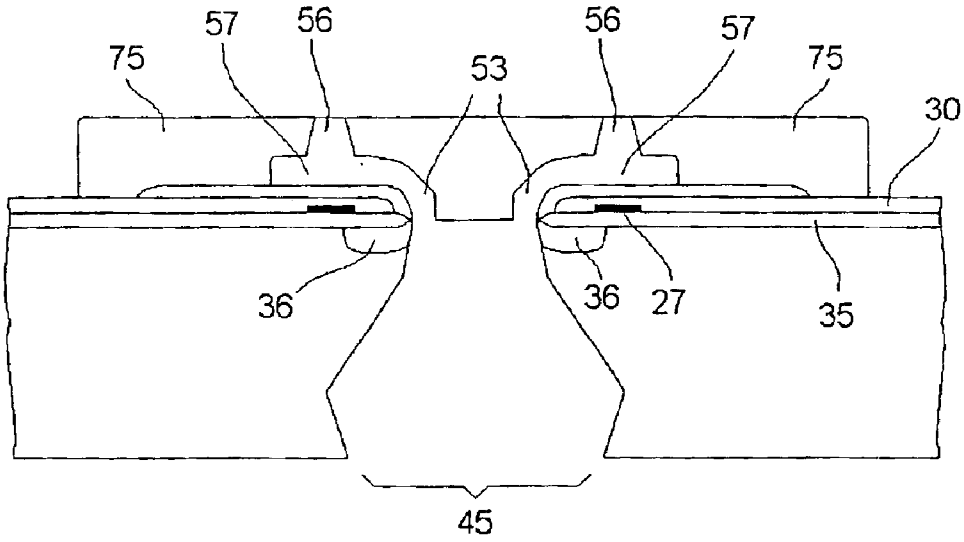
FIG. 20—illustrates a section of the finished actuator according to the third embodiment.

In the step 221, described with reference to FIG. 20, the casts 156 of positive photoresist are removed by means of a bath in a solvent suitable for the photoresist and which does not attack the structure 75. Following this operation the nozzles 56 are obtained, the shape of which is exactly that of the casts 156, as described in the already cited Italian patent application TO 2000A 000526.

In the step 222, again described with reference to FIG. 20, the metallic sacrificial layers 54' are removed with a chemical attack performed for instance by means of a solution of HCl and $HNO_3$. At the end of this operation, the ducts 53, shaped exactly like the protuberances 76, and the chambers 57, shaped exactly like the remaining part of the sacrificial layer 54', are obtained. This operation is described in detail in the cited Italian patent application TO 99A 000610 and, alternatively, may be performed by means of an electrochemical attack that uses as the electrode the anti-cavitation layer 26, as described in detail in the already cited Italian patent application TO 99A 000987.

Finally the steps 224 and 225, already described, are performed.

4th Embodiment

This embodiment may be produced either by way of the process corresponding to the flow diagram of FIG. 8 in which the sacrificial layers 54 of photopolymer are grown, or by way of the process corresponding to the flow diagram of FIG. 17 in which the metallic sacrificial layers 54' are grown. It is described with reference to FIG. 21, where the metallic sacrificial layers 54' are indicated, for example.

According to this embodiment, the layer of tantalum-aluminum, which is deposited in any case in order to produce the resistors 27, is also applied local to the P+ contact 37 where it is indicated using the numeral 27', in order to ensure a better ohmic contact with the P+ contact 37 itself.

Figure 21:
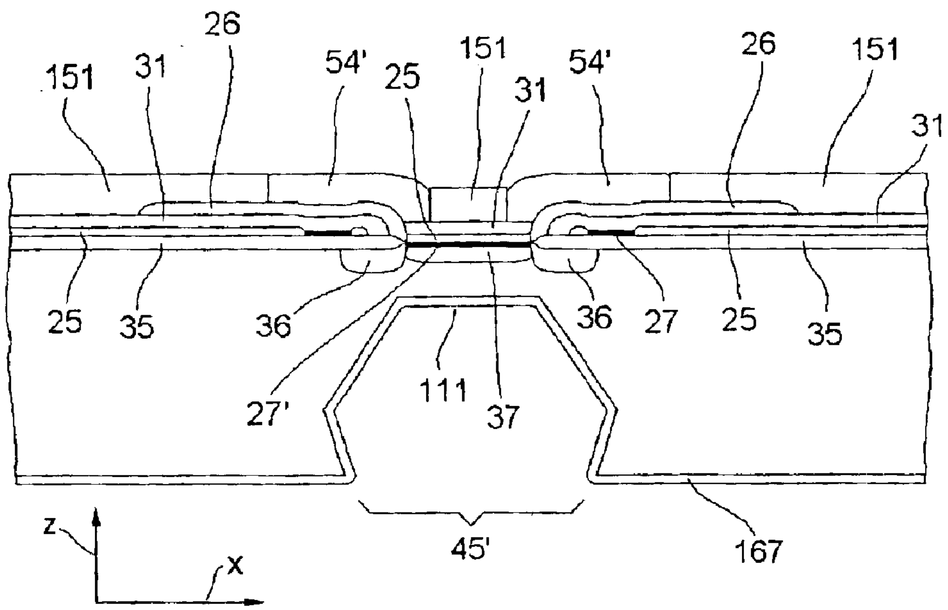
FIG. 21—represents a section of the actuator according to a fourth embodiment, after the steps of dry and wet etching, and production of the sacrificial layers.

Shown in FIG. 21 are a first metal 25 and a second metal 31, already present but not described in the earlier embodiments, made for instance of a layer of aluminum having thickness 0.5 μm. The first metal 25 has the purpose of connecting the resistors 27 to the relative control circuits, and the latter to the logic circuits. The second metal 31 interconnects the power circuits on the inside of the die and connects the circuits of the die with the soldering pads, not indicated in any of the figures.

In this embodiment, the two metals 25 and 31, or one only of these, are extended to cover the layer 27' of tantalum-aluminum local to the P+ contact 37. In this way, a layer is produced having low electrical resistivity, for example 25 mΩ/□, which is about one thousandth of the resistivity of the P+ contact 37 which could be, for instance, 25 Ω/□. This improves uniformity of the potential between all the P+ contacts 37 and on the inside of the contacts themselves, and therefore makes etching of the P+ contacts 37 even.

The step 217, electrochemical etching of the P+ contact 37, is continued until a good part of the aluminum of the two metals 25 and 31 is removed, thereby ensuring complete elimination of the P+ contact 37. The residual aluminum is then removed in a specific chemical attack.

Figure 22:
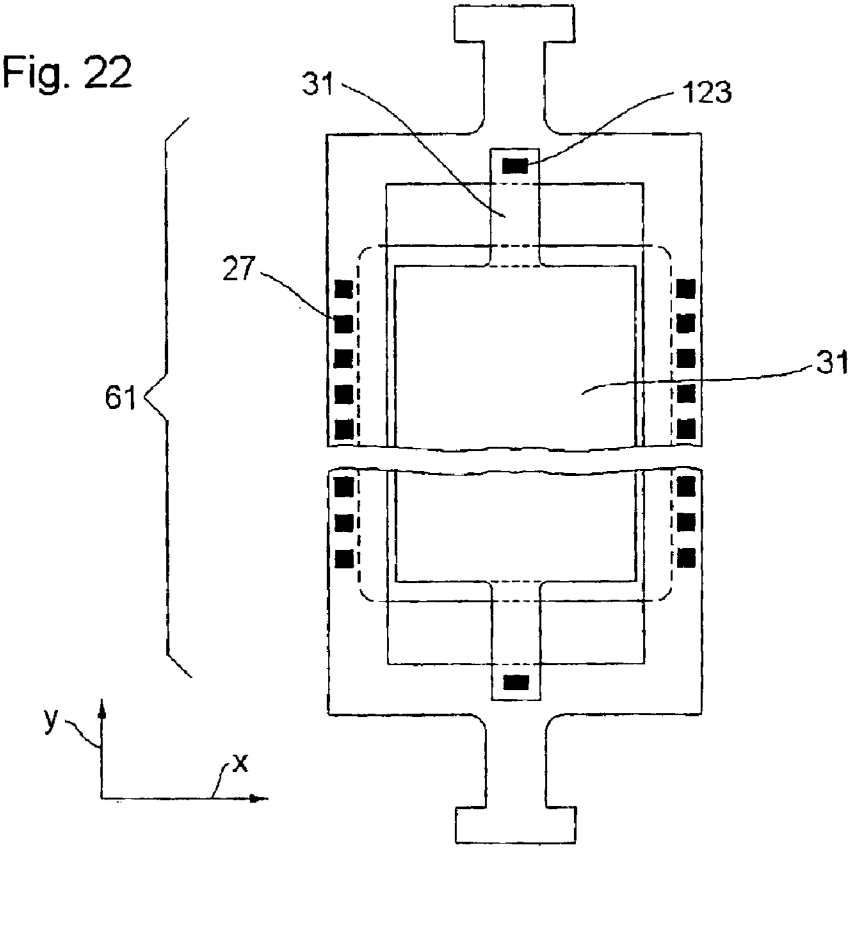
FIG. 22—represents a view of the die according to the fourth embodiment.

FIG. 22 shows the die 61 projected along a plane x-y. The second metal 31 is visible, extending until it overlays the anti-cavitation layer 26 at the two ends of the die. In the overlay zones, without adding any step to the process, one or more electrical contacts 123 are made between the second metal 31 and the anti-cavitation layer 26 which ensure transit of the currents needed during the electrochemical growths and removals, and avoid the production of other "vias". The two metals 25 and 31 ensure equipotentiality all through the die 61.

Alternatively, the contact with the layer 26 may be made by way of the first metal 25.

If the process corresponding to the flow diagram of FIG. 17 is adopted in which the metallic sacrificial layers 54' are grown, the presence of the two metals 25 and 31 local to the P+ contact 37 offers a further advantage. In fact, during the step 211, production of the metallic sacrificial layers 54', the protuberances 76 are obtained by vertical growth due to the electrochemical effect of the current flowing through the first metal 25 and the second metal 31 suitably activated on the surface, and not by lateral growth: the protuberances 76 may therefore assume with precision whatever the shape and size designed, without the intrinsic limitations of lateral growth.

Figure 23:
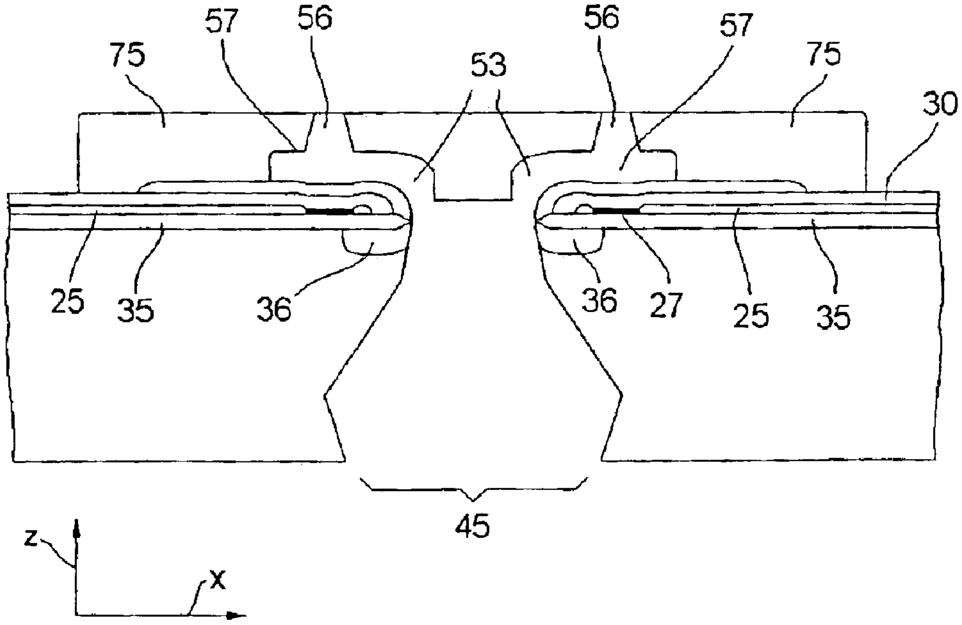
FIG. 23—represents a section of the finished actuator according to the fourth embodiment.

Finally also shown in FIG. 23 is a section parallel to the plane x-z of the finished actuator.

What is claimed is:

1. A process for manufacturing a thermal ink jet printhead comprising nozzles, chambers and a groove suitable for fluidly ducting ink to said chambers, comprising the steps of:

arranging a wafer containing a geometric reference, and having an upper face and a lower face, producing a first portion of said groove by means of a dry etching on said lower face, and producing a second portion of said groove by means of an electrochemical etching; and producing an anti-cavitation layer of electrically conducting material on said upper face; said step of producing said second portion of said groove by means of said electrochemical etching uses as the electrode, said anti-cavitation layer of electrically conducting material.

2. The process according to claim 1, further comprising the steps of:

growing sacrificial layers on said upper face;

growing casts on said sacrificial layers;

removing said casts and said sacrificial layers.

3. The process according to claim 2, wherein said step of growing sacrificial layers on said upper face further comprises a step of growing metallic sacrificial layers on said upper face; and said step of removing said casts and said sacrificial layers further comprises the steps of: removing said casts; and removing said metallic sacrificial layers.

4. The process according to claim 3, wherein said step of growing metallic sacrificial layers on said upper face, also comprises a step of growing protuberances using at least in part a lateral growth phenomenon.

5. The process according to claim 1, further comprising a step of growing a first metal or a second metal, and wherein said anti-cavitation layer and said first metal or said second metal are extended locally to a P+ contact.

6. The process according to claim 1, further comprising a step of producing oblique walls in said first portion of said groove by means of a wet etching.

7. A process for manufacturing a thermal ink jet printhead comprising nozzles, chambers and a groove suitable for fluidly ducting ink to said chambers, comprising the steps of:

arranging a wafer containing a geometric reference, and having an upper face and a lower face;

producing a first portion of said groove by means of a dry etching on said lower face;

producing a second portion of said groove by means of an electrochemical etching;

producing an anti-cavitation layer of electrically conducting material on said upper face;

growing a first metal or a second metal, and wherein said anti-cavitation layer and said first metal or said second metal are extended locally to a P+ contact.

8. The process according to claim 7, further comprising a step of growing metallic sacrificial layers on said upper face and a step of growing protuberances using a vertical growth means.

* * * * *

UNITED STATES PATENT AND TRADEMARK OFFICE
CERTIFICATE OF CORRECTION

PATENT NO. : 6,887,393 B2
DATED : May 3, 2005
INVENTOR(S) : Renato Conta et al.

It is certified that error appears in the above-identified patent and that said Letters Patent is hereby corrected as shown below:

Title page,
Item [73], Assignee, replace “Turin” with -- Torino --.

Signed and Sealed this

Third Day of January, 2006

JON W. DUDAS
*Director of the United States Patent and Trademark Office*